(12) United States Patent
Caldwell

(10) Patent No.: US 6,563,198 B1
(45) Date of Patent: May 13, 2003

(54) ADHESIVE PAD HAVING EMC SHIELDING CHARACTERISTICS

(75) Inventor: Barry Caldwell, Hesston, KS (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/932,307

(22) Filed: Aug. 17, 2001

Related U.S. Application Data

(63) Continuation-in-part of application No. 09/920,144, filed on Aug. 1, 2001.

(51) Int. Cl.[7] .............................................. H01L 23/552
(52) U.S. Cl. ..................... 257/659; 257/712; 257/700; 257/783
(58) Field of Search ................................. 257/659, 700, 257/712, 753, 783, 705–707, 737–738, 777

(56) References Cited

U.S. PATENT DOCUMENTS

| | | | | |
|---|---|---|---|---|
| 4,339,628 A | * | 7/1982 | Marcantonio et al. | .... 174/35 R |
| 4,710,798 A | * | 12/1987 | Marcantonio | ................ 357/80 |
| 5,294,826 A | * | 3/1994 | Marcantonio et al. | ...... 257/659 |
| 5,502,289 A | * | 3/1996 | Takiar et al. | ................ 174/266 |
| 5,591,034 A | | 1/1997 | Ameen et al. | |
| 5,615,086 A | | 3/1997 | Collins et al. | |
| 5,621,615 A | | 4/1997 | Dawson et al. | |
| 5,707,715 A | * | 1/1998 | deRochemont et al. | ..... 428/210 |
| 5,726,079 A | * | 3/1998 | Johnson | ..................... 438/106 |
| 5,785,913 A | | 7/1998 | Clark, Jr. et al. | |
| 5,796,170 A | * | 8/1998 | Marcantonio | ................ 257/786 |
| 5,808,878 A | * | 9/1998 | Saito et al. | .................. 361/818 |
| 5,847,929 A | | 12/1998 | Bernier et al. | |
| 5,866,942 A | * | 2/1999 | Suzuki et al. | ................ 257/698 |
| 5,866,943 A | * | 2/1999 | Mertol | ......................... 257/712 |
| 5,880,403 A | * | 3/1999 | Czajkowski et al. | .......... 174/35 |
| 5,969,947 A | | 10/1999 | Johnson et al. | |
| 6,011,299 A | * | 1/2000 | Brench | ........................ 257/660 |
| 6,019,165 A | * | 2/2000 | Batchelder | .................. 165/80.3 |
| 6,069,023 A | | 5/2000 | Bernier et al. | |
| 6,097,602 A | | 8/2000 | Witchger | |
| 6,191,360 B1 | * | 2/2001 | Tao et al. | ................... 174/52.4 |
| 6,212,074 B1 | | 4/2001 | Gonsalvez et al. | |
| 6,327,145 B1 | | 12/2001 | Lian et al. | |
| 2001/0004132 A1 | * | 6/2001 | Bergstedt et al. | ........... 257/728 |

FOREIGN PATENT DOCUMENTS

| | | | | |
|---|---|---|---|---|
| JP | 405037122 A | * | 2/1993 | ............ H05K/1/18 |
| JP | 1997-0170341 | * | 6/1997 | ............ G06F/1/20 |
| JP | 02000191998 A | * | 7/2000 | ............ C09J/9/00 |
| JP | 02000195998 A | * | 7/2000 | ......... H01L/23/373 |

* cited by examiner

*Primary Examiner*—Amir Zarabian
*Assistant Examiner*—Monica Lewis
(74) *Attorney, Agent, or Firm*—Suiter & Associates, P.C.

(57) ABSTRACT

The present invention is directed to the present invention is directed to an adhesive pad with electromagnetic compatibility (EMC) characteristics. An adhesive pad suitable for bonding electrical components may include a thermal bonding adhesive material and a lattice interlayer. The adhesive material is suitable for being disposed between the first electrical component and the second component, the thermal bonding adhesive bonding the first electrical component to the second component. The lattice interlayer is included within said thermal bonding adhesive material, the lattice interlayer having electromagnetic capability (EMC) shielding characteristics.

20 Claims, 3 Drawing Sheets

ADHESIVE PAD HAVING EMC SHIELDING CHARACTERISTICS

CROSS REFERENCE TO RELATED APPLICATION

The present invention is a Continuation-in-Part of U.S. patent application Ser. No. 09/920,144 filed Aug. 1, 2001, said U.S. Patent Application 09/920,144 is herein incorporated by reference in its entirety.

FIELD OF THE INVENTION

The present invention generally relates to the field of electronic components, and particularly to a composition with EMC shielding characteristics.

BACKGROUND OF THE INVENTION

As electronics have proliferated, the speed of the systems has increased while the space in which the systems are provided has decreased. For example, system performance that was only available in a personal computer tower systems of yesterday may now be found in hand-held devices today. The inclusion of these components in a limited space may cause one component to interfere with another component.

Additionally, modern electronic systems encounter many electromagnetic compatibility (EMC) effects, including electromagnetic interference (EMI). For example, noisy systems may interfere with nearby external components, such as displays, communications systems, and the like. Additionally, systems may be susceptible to external effects such as electrostatic discharge, lightning, and the like. Even internal EMC effects may be encountered due to such things as crosstalk, ground bounce, power disturbances, and the like.

Further, as the speed of components has increased, the resulting heat generated by the components has also increased. This heat may damage not only the component itself, but also the components surrounding the heat-generating component. Such a problem may be further magnified by the smaller sizes of electronic devices encountered today, as the components are more closely packed together.

Therefore, it would be desirable to provide a heat sink ferrite adhesive pad.

SUMMARY OF THE INVENTION

Accordingly, the present invention is directed to an adhesive pad with electromagnetic compatibility (EMC) characteristics. In a first aspect of the present invention, an adhesive pad suitable for bonding electrical components includes a thermal bonding adhesive material and a lattice interlayer. The adhesive material is suitable for being disposed between the first electrical component and the second component, the thermal bonding adhesive bonding the first electrical component to the second component. The lattice interlayer is included within said thermal bonding adhesive material, the lattice interlayer having electromagnetic capability (EMC) shielding characteristics.

In a second aspect of the present invention, An electrical system includes a first electrical component, a second component, a thermal bonding adhesive material and a lattice interlayer. The first electrical component is suitable for providing a function, the electrical component including a first surface. The second component includes a second surface. A thermal bonding adhesive material is disposed between the first electrical component and the second component, the thermal bonding adhesive bonding the first electrical component to the second component. A lattice interlayer is also included within said thermal bonding adhesive material, the lattice interlayer having electromagnetic capability (EMC) shielding characteristics.

In a third aspect of the present invention, an electrical system, includes an integrated circuit, the integrated circuit including a first surface, a heat sink including a second surface and a thermal bonding adhesive material disposed between the first electrical component and the second component. The thermal bonding adhesive bonds the integrated circuit to the heat sink. A lattice interlayer is included within said thermal bonding adhesive material, the lattice interlayer having electromagnetic capability (EMC) shielding characteristics.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 3B is an illustration of an exemplary embodiment of the present invention wherein a first adhesive layer and a second adhesive layer have a lattice interlayer disposed in-between.

DETAILED DESCRIPTION OF THE INVENTION

Reference will now be made in detail to the presently preferred embodiments of the invention, examples of which are illustrated in the accompanying drawings.

Referring generally now to FIGS. 1 through 3B, exemplary embodiments of the present invention are shown. Modem electronic systems encounter many electromagnetic compatibility (EMC) effects, including electromagnetic interference (EMI). Additionally, systems may be susceptible to external effects such as electrostatic discharge, lightning, and the like. Even internal EMC effects may be encountered due to such things as crosstalk, ground bounce, power disturbances, and the like. However, by utilizing the present invention, such problems may be minimized and reduced, thereby permitting closer component proximity, smaller systems, and the like.

Figure 1:
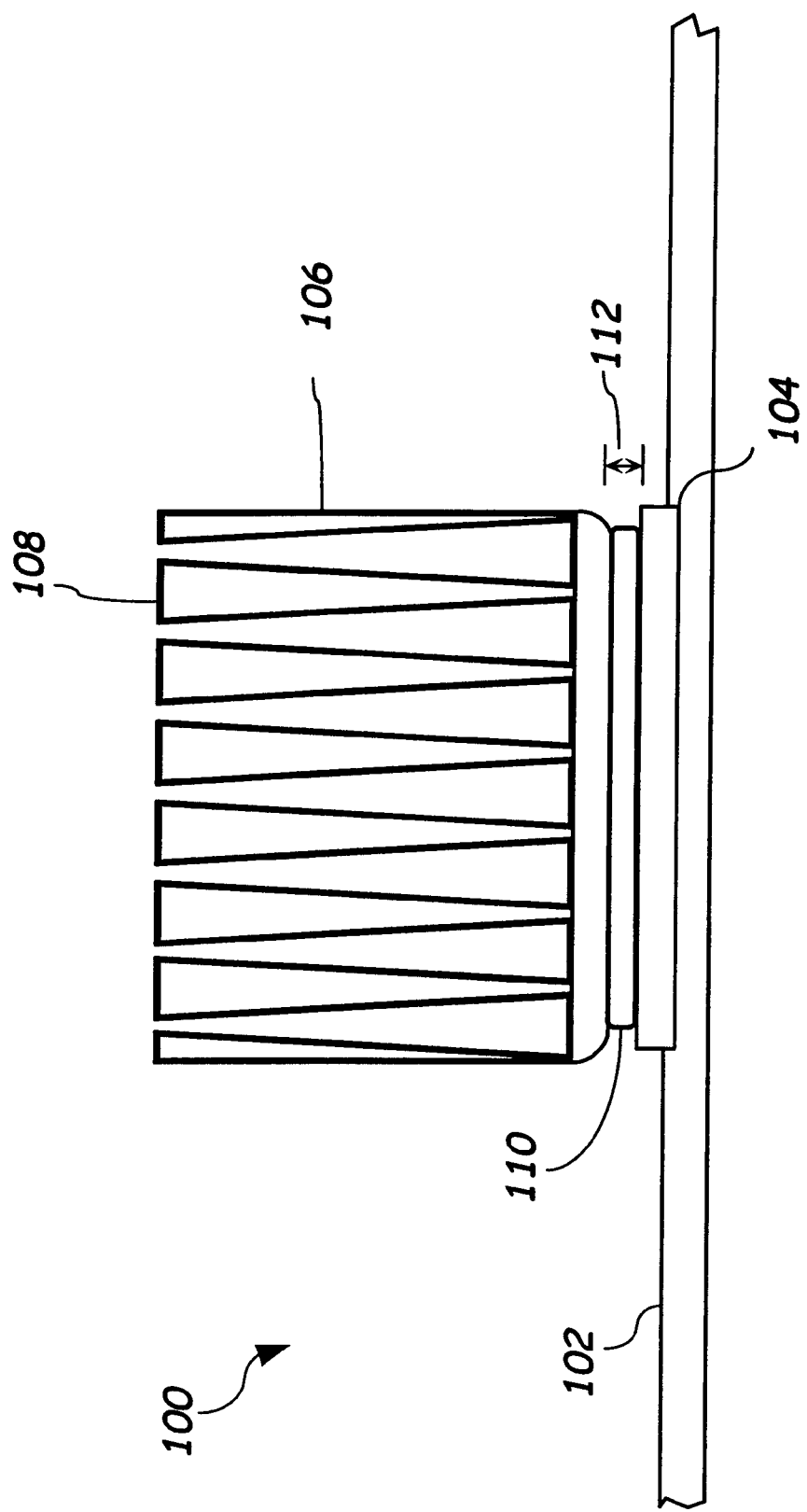
FIG. 1 is an illustration of an exemplary embodiment of the present invention wherein a computer chip utilizes a heat sink attached to the computer chip with an adhesive pad to provide cooling.

Referring now to FIG. 1, an embodiment 100 of the present invention is shown wherein a computer chip utilizes a heat sink attached to the computer chip with an adhesive to provide cooling. A substrate 102 includes a computer chip 104, such as an integrated circuit, controller, processor, and the like, disposed thereon. In operation, the computer chip 104 may generate heat, which may cause damage not only to the chip itself, but to other components surrounding the chip. Therefore, to dissipate the generated heat, a heat sink 106 is provided.

A heat sink 106 is a component that absorbs and dissipates heat produced by components, such as an electrical component, to prevent overheating. Heat sinks are typically made of a thermally conductive material, such as a metal, and often include fins 108 to assist in transferring heat to the atmosphere. To attach the heat sink 106 to the computer chip 104, an adhesive pad 110 is provided. The adhesive pad 110 is thermally conductive to enable heat to be transferred from the computer chip 104 to the heat sink 106. Additionally, the adhesive pad 110 provides better contact between the computer chip 104 and the heat sink 106, and enables more secure mounting of the heat sink 106 than using direct attachment of the heat sink 106 to the substrate 102 itself. The space 112 between components may be occupied by adhesive pad 110. In this way, supplementary attachment devices, such as braces and the like, are not needed to provide a secure connection between the heat sink 106 and the computer chip 104.

However, during operation of the computer chip 104, electromagnetic capability (EMC) issues may arise. EMC is a super set of electromagnetic interference (EMI). For instance, EMC also includes susceptibility and immunity issues along with electrostatic discharge (ESD) issues and additional voltage and current influenced actions. These electromagnetic capability issues may affect not only the chip itself, but also the surrounding components. For example, an information handling system, such as a personal computer, convergence system, information appliance, Internet appliance, personal digital assistant, and the like, may include components such as network connection devices, computer chips, video components, and the like, which may be effected by the electromagnetic capability (EMC) issues of the computer chip 104. However, by providing an adhesive 110 with EMC shielding characteristics, these problems may be reduced.

The adhesive pad may include a material that provides EMC suppression. For instance, ceramic ferromagnetic materials, such as ferrites, and Mu metals may be provided to shield the computer chip 104, both from affecting surrounding components, as well as being affected by the surrounding components. For instance, ferrite shielding helps control and mitigate the actions and influences that these electrical forces may cause. For example, ferrites, such as the ferrites supplied by the Steward Corporation, and Mu metals, such as the Mu metals (such as magnetic shielding alloys) from ASC Scientific and Ed Fagan Incorporated, may provide high frequency noise suppression performance due to the frequency dependent complex impedance nature of the material. Additionally, ferrites may provide significant EMI reduction while remaining transparent to normal circuit operation.

Figure 2A:
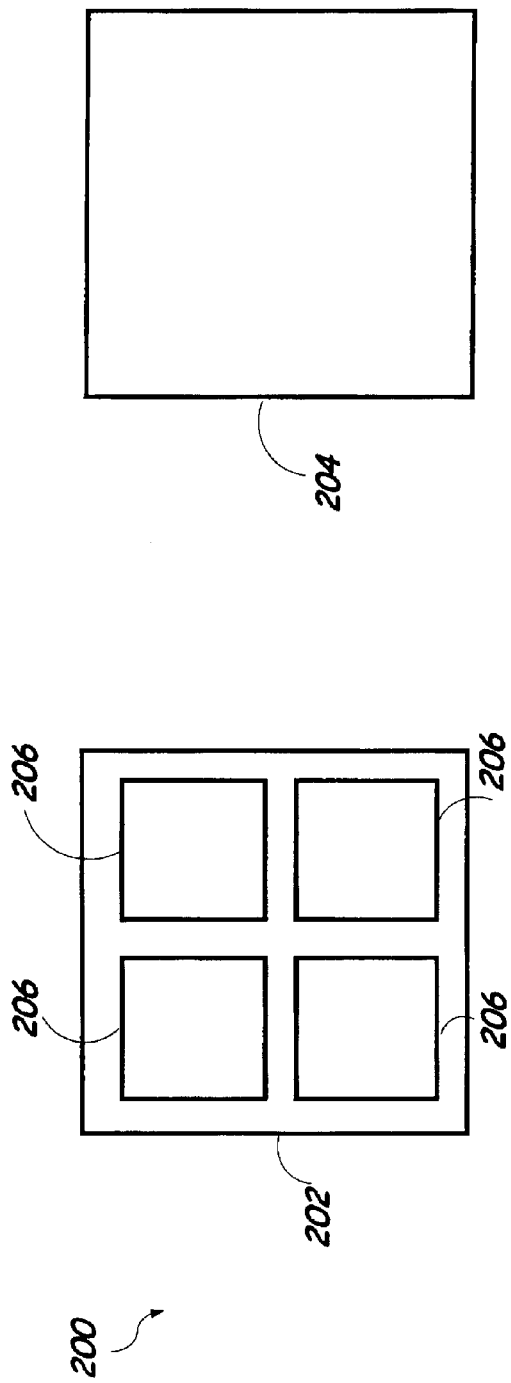
FIG. 2A is an illustration of an exemplary embodiment of the present invention wherein an adhesive pad includes a lattice interlayer having electromagnetic shielding characteristics.

Referring now to FIG. 2A, an embodiment of the present invention is shown wherein an adhesive pad includes a lattice interlayer having electromagnetic shielding characteristics. An adhesive pad 200 may include a lattice interlayer 202 and a thermal bonding adhesive material 204. The thermal bonding adhesive material 204 is suitable for providing a bond between components, such as the electrical components shown in FIG. 1. The lattice interlayer is formed of a material having electromagnetic capability shielding characteristics, such as ceramic ferromagnetic material, ferrites, Mu metals, and the like. In this way, the lattice interlayer 202 may protect a first component from affecting a second component, such as an integrated circuit from affecting its surrounding environment, being affected by its surrounding environment, and the like.

Additionally, the lattice interlayer is formed to include a plurality of openings 206, such as at least two openings having a size smaller than a surface area of an adjoining component to which it is attached. Although the openings 206 shown in FIG. 2A are of uniform size and placement, it should be apparent that a variety of opening shapes and placements are contemplated by the present invention without departing from the spirit and scope thereof. The openings 206 in the lattice interlay 202 may permit the adhesive material 204 to form a bond between components. Further, the openings 206 may be formed to prevent passage of EMC. For example, openings 206 may be sized between approximately $\frac{1}{10}$ and $\frac{1}{4}$ of a wavelength, wherein wavelength dimension is based on frequencies inherent in at least one of the first component and the second component. In this way, the openings of the lattice interlayer may provide passage of thermal bonding material, and also provide shielding characteristics for EMI emitted by the components.

Figure 2B:
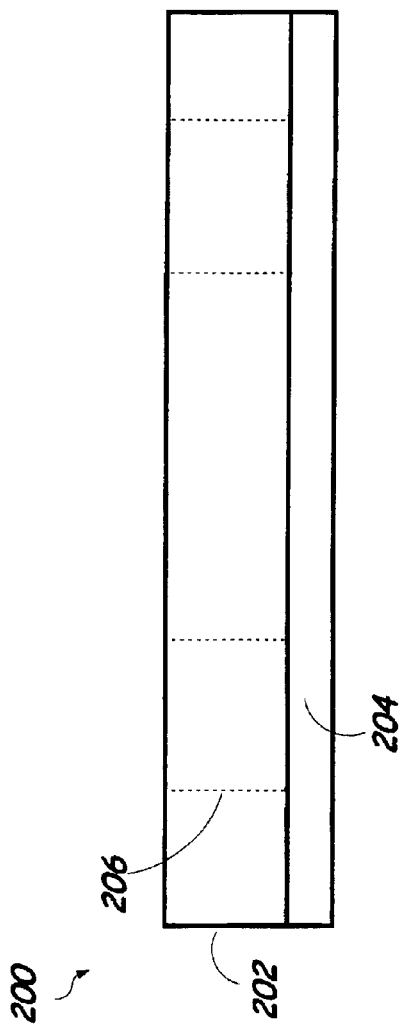
FIG. 2B is an illustration of an exemplary embodiment of the present invention wherein an adhesive material is extruded through openings in a lattice interlayer.

For example, as shown in FIG. 2B, adhesive material 204, forming a generally continuous surface on a first side of a lattice interlayer 202 for attaching to a first component, is extruded through openings 206 in the lattice interlayer 202 suitable for attaching to a second component. Preferably, the generally continuous attachment surface would attach to a chip package, and the like, to reduce space between the lattice interlayer 202 where high frequency electromagnetic waves may be generated. This may help to minimize electromagnetic coupling to a heat sink, which may act as a radiating antenna. For instance, referring again to FIG. 1, a computer chip 104 may generate high frequency radiation, that, if a heat sink 106 is attached to the computer chip 104, the heat sink may act as a radiating antenna for the high frequency radiation, thereby causing electromagnetic capability problems with other components included with a.system.

Figure 3A:
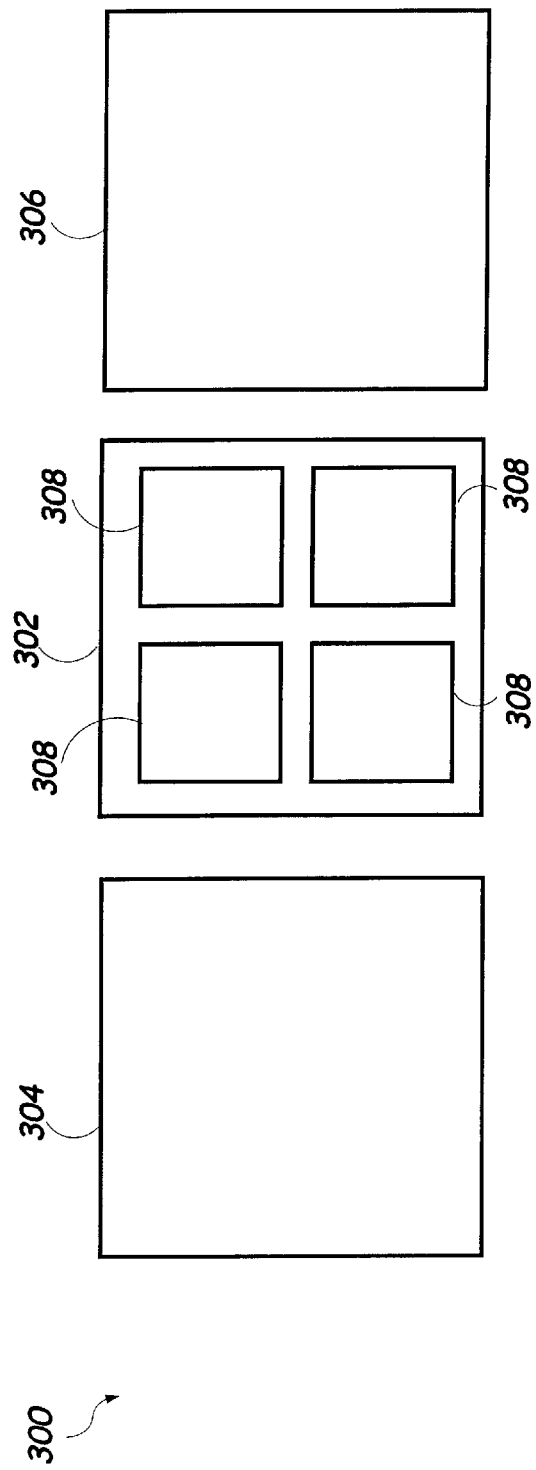
FIG. 3A is an illustration of an exemplary embodiment of the present invention wherein an adhesive pad is formed including multiple adhesive material layers including an electromagnetic capability shielding lattice interlayer.

Referring now to FIG. 3A, an embodiment of the present invention is shown wherein an adhesive pad is formed including multiple adhesive material layers including an electromagnetic capability shielding lattice interlayer. An adhesive pad 300 includes a lattice interlayer 302 disposed between a first adhesive layer 304 and a second adhesive layer 306. In this way, an embedded lattice interlayer 302 is provided between the adhesive layers to form an adhesive pad "sandwich." In this example, two generally continuous adhesive surfaces are provided to reduce space between the components, such as the space 112 shown in FIG. 1. Further, the adhesive layers 304 and 306 may bond through openings in the lattice interlayer to provide additional securing of the components.

Figure 3B:
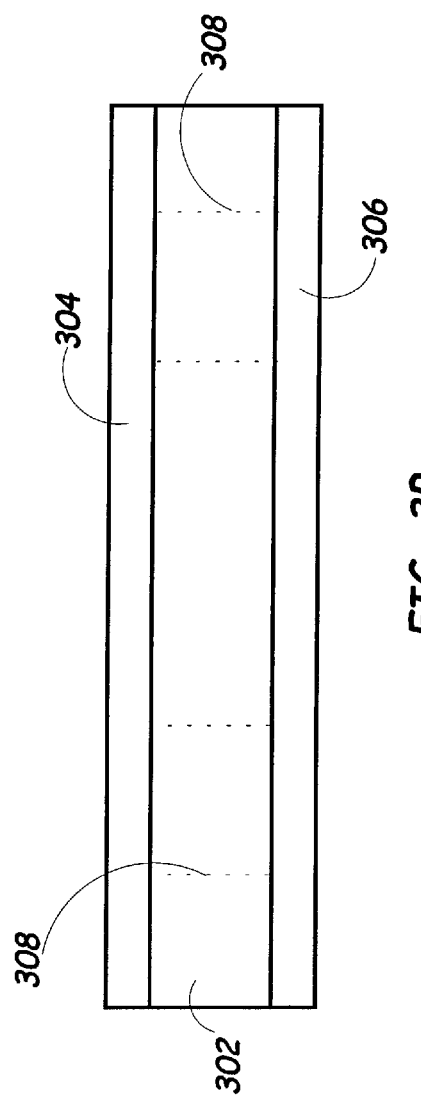

For instance, as shown in FIG. 3B, a first adhesive layer 304 and a second adhesive layer 306 may have a lattice interlayer 302 disposed in-between. The lattice interlayer includes a plurality of openings 308 between 3 microns and 1 millimeter in width. In this way, the first adhesive layer 304 may bond directly with the second adhesive layer 306 or providing securing between components.

It is believed that the adhesive pad having EMC characteristics of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An adhesive pad suitable for bonding electrical components, comprising:

a thermal bonding adhesive material suitable for being disposed between the first electrical component and the second component, the thermal bonding adhesive bonding the first electrical component to the second component; and a lattice interlayer included within said thermal bonding adhesive material, the lattice interlayer having electromagnetic capability (EMC) shielding characteristics.

2. The adhesive pad as described in claim 1, wherein the lattice interlayer includes a plurality of holes having an opening of generally 1/10 to approximately 1/4 of a wavelength, wherein wavelength dimension is based on a frequency emitted by at least one of the first component and the second component.

3. The adhesive pad as described in claim 2, wherein the emitted frequency is EMI.

4. The adhesive pad as described in claim 1, wherein the thermal bonding adhesive material includes a first thermal bonding adhesive portion and a second thermal bonding adhesive portion disposed on opposing side of the lattice interlayer.

5. The adhesive pad as described in claim 1, wherein the thermal bonding adhesive material includes a first side have a generally continuous surface suitable for bonding to at least one of the first electrical component and the second component and a second side at least partially extending through an opening in the lattice interlay so that the second side bonds to at least one of the first electrical component and the second component.

6. The adhesive pad as described in claim 1, wherein the first electrical component includes a computer chip and the second electrical component is a heat sink.

7. The adhesive pad as described in claim 1, wherein the lattice interlayer includes at least one of ceramic ferromagnetic material and magnetic shielding alloy.

8. The adhesive pad as described in claim 7, wherein the ceramic ferromagnetic material includes ferrite.

9. The adhesive pad as described in claim 1, wherein the lattice interlayer is sufficient to provide EMC shielding between the first electrical component and the second component.

10. An electrical system, comprising:

a first electrical component suitable for providing a function, the electrical component including a first surface;

a second component including a second surface;

a thermal bonding adhesive material disposed between the first electrical component and the second component, the thermal bonding adhesive bonding the first electrical component to the second component; and a lattice interlayer included within said thermal bonding adhesive material, the lattice interlayer having electromagnetic capability (EMC) shielding characteristics.

11. The electrical system as described in claim 10, wherein the lattice interlayer includes a plurality of holes having an opening of generally 1/10 to approximately 1/4 of a wavelength, wherein wavelength dimension is based on a frequency inherent in at least one of the first component and the second component.

12. The electrical system as described in claim 11, wherein the frequency is emitted as EMI by at least one of the first component and the second component.

13. The electrical system as described in claim 10, wherein the thermal bonding adhesive material includes a first thermal bonding adhesive portion and a second thermal bonding adhesive portion disposed on opposing side of the lattice interlayer.

14. The electrical system as described in claim 10, wherein the thermal bonding adhesive material includes a first side have a generally continuous surface suitable for bonding to at least one of the first electrical component and the second component and a second side at least partially extending through an opening in the lattice interlay so that the second side bonds to at least one of the first electrical component and the second component.

15. The electrical system as described in claim 10, wherein the first electrical component includes a computer chip and the second electrical component is a heat sink.

16. The electrical system as described in claim 10, wherein the lattice interlayer includes at least one of ceramic ferromagnetic material and magnetic shielding alloy.

17. The electrical system as described in claim 16, wherein the ceramic ferromagnetic material includes ferrite.

18. The electrical system as described in claim 10, wherein the lattice interlayer is sufficient to provide EMC shielding between the first electrical component and the second component.

19. An electrical system, comprising:

an integrated circuit, the integrated circuit including a first surface;

a heat sink including a second surface;

a thermal bonding adhesive material disposed between the integrated circuit and the heat sink, the thermal bonding adhesive bonding the integrated circuit to the heat sink; and a lattice interlayer included within said thermal bonding adhesive material, the lattice interlayer having electromagnetic capability (EMC) shielding characteristics.

20. The electrical system as described in claim 19, wherein the lattice interlayer includes at least one of ceramic ferromagnetic material and magnetic shielding alloy.

* * * * *